: US 7,218,164 B2
(45) Date of Patent: May 15, 2007

(54) EMITTER SWITCHING DRIVING NETWORK TO CONTROL THE STORAGE TIME

(75) Inventors: Giovanni Vitale, Ragusa (IT); Rosario Scollo, Misterbianco (IT); Simone Buonomo, Augusta (IT)

(73) Assignee: STMicroelectronics, S.r.l. (IT)

( * ) Notice: Subject to any disclaimer, the term of this patent is extended or adjusted under 35 U.S.C. 154(b) by 42 days.

(21) Appl. No.: 11/097,442

(22) Filed: Mar. 31, 2005

(65) Prior Publication Data

US 2005/0231242 A1 Oct. 20, 2005

(30) Foreign Application Priority Data

Mar. 31, 2004 (EP) ................................. 04425237

(51) Int. Cl.
*H03K 17/04* (2006.01)
(52) U.S. Cl. ...................................... 327/376; 327/377
(58) Field of Classification Search ................ 327/376, 327/377, 375, 374, 380–383, 389, 391, 427, 327/432, 433, 434, 436
See application file for complete search history.

(56) References Cited

U.S. PATENT DOCUMENTS 4,695,770 A * 9/1987 Raets .......................... 315/207
6,091,276 A * 7/2000 Aiello et al. ................. 327/376
6,255,890 B1 * 7/2001 Aiello et al. ................. 327/432
7,053,678 B2 * 5/2006 Scollo et al. ................ 327/108

FOREIGN PATENT DOCUMENTS

JP 59163918 9/1984

OTHER PUBLICATIONS

European Search Report, EP04425237, Oct. 18, 2004.
Self Optimizing Low Energy Drive Circuit for Emitter-Switched Transistor, IBM Technical Disclosure Bulletin, vol. 39, No. 1, Jan. 1996.
Rischmuller, Klaus, Simplified Switch-Mode Base Driver With The L4974 Power IC, Electric Engineering, vol. 62, No. 762, Jun. 1990.

* cited by examiner

*Primary Examiner*—Linh My Nguyen
(74) *Attorney, Agent, or Firm*—Lisa K. Jorgenson; Graybeal Jackson Haley LLP; Paul F. Rusyn

(57) ABSTRACT

A driving network for an emitter-switching circuit comprises a pair of cascode-configured transistors, the one of the bipolar type and the other of the MOS type, and the driving network is of the type comprising a driving block for respective conduction terminals and of said pair of transistors. The driving network (20, 30) further comprises sensor means in the driving block suitable for measuring a voltage to be compared with a reference value in a first comparator block. A negative feedback network between the output of the comparator and the driving block to provides a voltage value to said driving block to bias the conduction terminal of the bipolar transistor of the emitter-switching circuit in order to regulate the storage time thereof.

28 Claims, 13 Drawing Sheets

EMITTER SWITCHING DRIVING NETWORK TO CONTROL THE STORAGE TIME

PRIORITY CLAIM

This application claims priority from European patent application No. 04425237.7, filed Mar. 31, 2004, which is incorporated herein by reference.

FIELD OF APPLICATION

The present invention relates to an Emitter-Switching circuit driving network wherein the emitter-switching circuit comprises a pair of cascode-configured transistors, one of the bipolar type and one of the MOS type and the driving network is of the type comprising a driving circuit for respective conduction terminals of said pair of transistors.

PRIOR ART

As it is well known, an emitter-switching-configured circuit consists of the cascode connection of a bipolar transistor having a high breakdown voltage and of a P-MOS low voltage transistor.

FIG. 1 shows a known driving block 2 for an emitter-switching configuration 1.

The emitter-switching block 1 is comprised between a coil L connected to a first supply voltage VCC and a second supply voltage, particularly a ground GND; the block is operated by means of two control terminals B and G connected to the bipolar and MOS transistors respectively.

The driving block 2 comprises a base resistance RB connected to a capacitor CB and to a zener diode DZ, being parallel-configured and directly connected in turn to the ground GND.

The driving block 2 is connected to a control terminal B of the bipolar transistor of the emitter-switching circuit 1 to be driven, as well as to the control terminal G of the MOS transistor of said emitter-switching circuit, by means of a resistance RG.

The capacitor CB serves to store energy during the bipolar transistor turn-off, in order to reuse it during the following turn-on and conduction of the transistor itself; the zener diode DZ serves to avoid that the voltage of the transistor control terminal B exceeds a predetermined value.

As already mentioned, the configuration of the driving circuit 2 of FIG. 1 is already known, but what makes it particularly interesting today is the current availability of bipolar transistors having a safety area for reverse squared biasing (RBSOA) (in the emitter-switching configuration) with a current close to the peak current and a voltage corresponding to the breakdown voltage between the collector and the emitter, the base being short-circuited with the emitter, indicated with $BV_{CES}$, as well as of P-MOS transistors having a very low equivalent resistance in conduction $R_{DSON}$ and, thus, almost comparable with ideal switches.

The main advantages of the driving circuit 2 shown in FIG. 1 are the very low voltage drop in conduction which is typical of bipolar transistors and the turn-off speed thereof. In fact, during the turn-off, the base current IB is equal to the collector current IC, and it is very high. This determines a drastic reduction both of the storage and of the fall time, allowing the circuit to operate even at a frequency of 150 kHz.

The described driving circuit 2 for the emitter-switching block 1 is very useful and effective in all those cases wherein the current IC on the bipolar transistor during the turn-on is null or very low with respect to the nominal one.

An embodiment of the driving circuit 2 of FIG. 1 is represented by converter devices of the "Flyback" type operating at a frequency of 100 kHz and having a null turn-on current, since the converter operates discontinuously. FIG. 2 shows waveforms related to this kind of converter.

Unfortunately, the driving being described, although very useful in the case being considered in the circuit of FIG. 1, cannot practically be used when operation occurs with bipolar transistor turn-on current values being non-null and at relatively high frequencies (>60 kHz), since, having to deal with a bipolar device, the dynamic $V_{CESAT}$ phenomenon is emphasised.

For this reason, with the driving circuit 2 of FIG. 1, an excessive power dissipation would occur on turning on the bipolar transistor due to the fact that the collector-emitter voltage would require a relatively long time (higher or equal to 2 µs) to reach the saturation value. Always referring to the circuit of FIG. 1, a base voltage increase of the bipolar transistor would only partially reduce the dynamic $V_{CESAT}$ problem, but it would excessively worsen performances when turning off.

A possible known technical solution to this problem is the driving circuit $2^I$ of FIG. 43, whose components and signals being already present in the driving circuit 2 of FIG. 1 and having the same structure and operation will be given the same previously used references.

The circuit $2^I$ is suitable for applications having a non-null collector current IC at the bipolar transistor turn-on.

This circuit differs from the circuit 2 because of the optimization block 3 comprising, unlike what is shown in circuit 2 of FIG. 1, a capacitor $CB^I$ arranged in series-configuration with the Zener diode DZ.

In summary, it can be said that the driving circuit 21 of FIG. 3 conveniently modulates the bipolar transistor base current IB, optimizing the turn-on and turn-off steps thereof and allowing the lowest $V_{CESAT}$ value to be reached.

An embodiment of the driving circuit $2^I$ of FIG. 3 is represented by "forward"-configured converter devices operating, for example, at a frequency being higher or equal to 100 kHz and wherein a modulation of the bipolar transistor base current IB is performed; FIG. 4 shows the waveforms obtained from this kind of converter.

Unfortunately, in the case of applications with non-null collector currents, in the transistor turn-on step, and meanwhile with a variable value in a wide range, the circuit shown in FIG. 3 must be sized taking into consideration the most stressful operating condition, i.e. what is reached with the highest collector current.

An example of this kind of application is represented by power factor controller stages PFC representing a resistive load for an alternate current source, receiving at the input an alternate current and outputting a direct current being regulated to be used as an ordinary converter input.

A correct saturation level $V_{CESAT}$ should be ensured to the highest current value, by conveniently selecting a new base voltage value, but in so doing, for low collector current values, the device would operate in over-saturation, obtaining extremely long storage times. This would involve an excessive turn-off dissipation, as well as inaccurate control due to the fact that the actual device turn-off would occur with delay with respect to the signal provided by the controller.

The just described problem has been already faced and proportional driving solutions have been provided.

A first solution is implemented by providing a base current being proportional to the collector current. In practice, by means of a network sensing the collector current, a base current being proportional to the collector current is provided, setting a predetermined ratio between said base and collector currents.

A second proportional driving solution is represented by the driving circuit $2^{II}$ shown in FIG. 5, wherein the components and signals being already in the driving circuits 2 and $2^{I}$ and having the same structure and operation will be given the same previously used references.

In this figure, the driving circuit $2^{II}$ implements a proportional driving solution, unlike the two known solutions of the driving circuits 2 and $2^{I}$, by inserting a current transformer T1 with a first winding L1 connected to the bipolar transistor collector and a second winding L2 connected to the base B of said bipolar transistor. In this latter case the IC/IB ratio between the base and collector currents is simply set by the turn ratio.

The bipolar transistor base terminal B is connected, by means of a base resistance RB, to a capacitor CB and to a block 4, being parallel-configured and directly connected in turn to the ground GND, as well as to the MOS transistor control terminal G, by means of a resistance RG. The block 4 comprises, unlike what is shown in circuits 2 and $2^{I}$, a diode D1 connected in series with the second winding L2 of the current transformer T1.

The proportional driving is a realization technique which is certainly valid for obtaining a reduced variation of the storage time between a highest collector current condition and a lowest collector current condition.

Unfortunately, even a limited storage time variation could make the cascode configuration non-applicable to last generation applications. In fact, these applications are characterized by a high operation frequency, but also by a wide collector current variation; examples of applications operating under these conditions and wherein up to now it has been impossible to use a bipolar transistor, in the CASCODE configuration and not, are:

PFC (Power Factor Controller);
Switching power suppliers operating at a higher frequency than 100 kHz with a wide load variation;
Generally all applications having a higher switching frequency than 100 kHz and with a highly variable load (induction heating, welding . . . )

The cascode configuration storage time, besides being a delay time between the moment the gate signal cancels out and when the device effectively turns off, also highlights the actual device saturation level.

As it is well known by using the cascode configuration in switching applications, ensuring the correct device saturation level means optimizing the device switching performances.

From the practice it is evident that setting a storage time within the range of 150~500 ns, according to the kind of device, is the best compromise to ensure that the device reaches a good saturation level in conduction and a not excessively long voltage rise time when turning off, thus reducing switching power dissipations when turning off. The device physical behavior changes when the collector current varies, as it is well highlighted by the traditional typical curve of the current gain variation hfe as a function of the current IC for a bipolar transistor, shown in FIG. 6.

It is clear that carrying out a proportional driving, i.e. setting a ratio between the base and collector currents for each collector current value, is not sufficient to ensure a constant storage time in the whole collector current variation range.

An ideal driving, i.e. a driving being capable of setting a constant storage time for each current IC value, would thus be the one fixing an IC/IB ratio being variable as a function of the collector current and being capable of following the current gain variation hfe law.

This problem is apparently complex since, besides succeeding in implementing a driving circuit following an IC/IB ratio, between the collector current and the base current, being variable as a function of a no more linear first order mathematical relationship, as it happens instead for the proportional driving, it would require such a network to be regulated each time as a function of the device being selected for the applications to be realized.

It must also be observed that sometimes the hfe spread variation of the devices on sale, although of the same type and by the same builder, is relatively high.

The technical problem of the present invention is to provide a driving network allowing the storage time of an emitter-switching circuit to be set and kept constant for the whole collector current variation range, overcoming the limitations and/or drawbacks affecting the prior art.

SUMMARY OF THE INVENTION

An aspect of the present invention is to realize a driving network allowing the bipolar transistor control terminal to be biased, wherein the parameter being controlled is the storage time.

The features and advantages of the system according to aspects of the invention will be apparent from the following description of an embodiment thereof given by way of non-limiting example with reference to the attached drawings.

BRIEF DESCRIPTION OF THE DRAWINGS

In these drawings:

FIG. 9b schematically shows the wave forms of the block of FIG. 9a.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
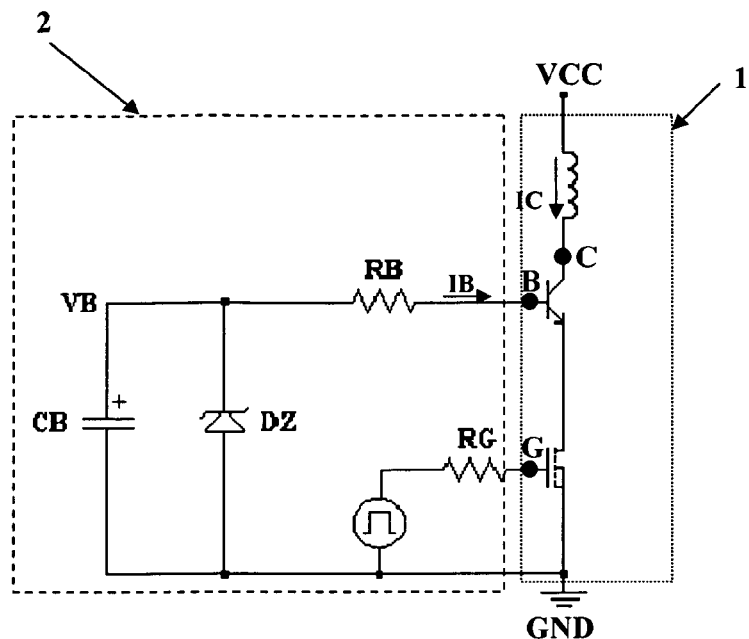
FIG. 1 schematically shows a traditional emitter-switching driving circuit with a null turn-on current according to the prior art.
Figure 2:
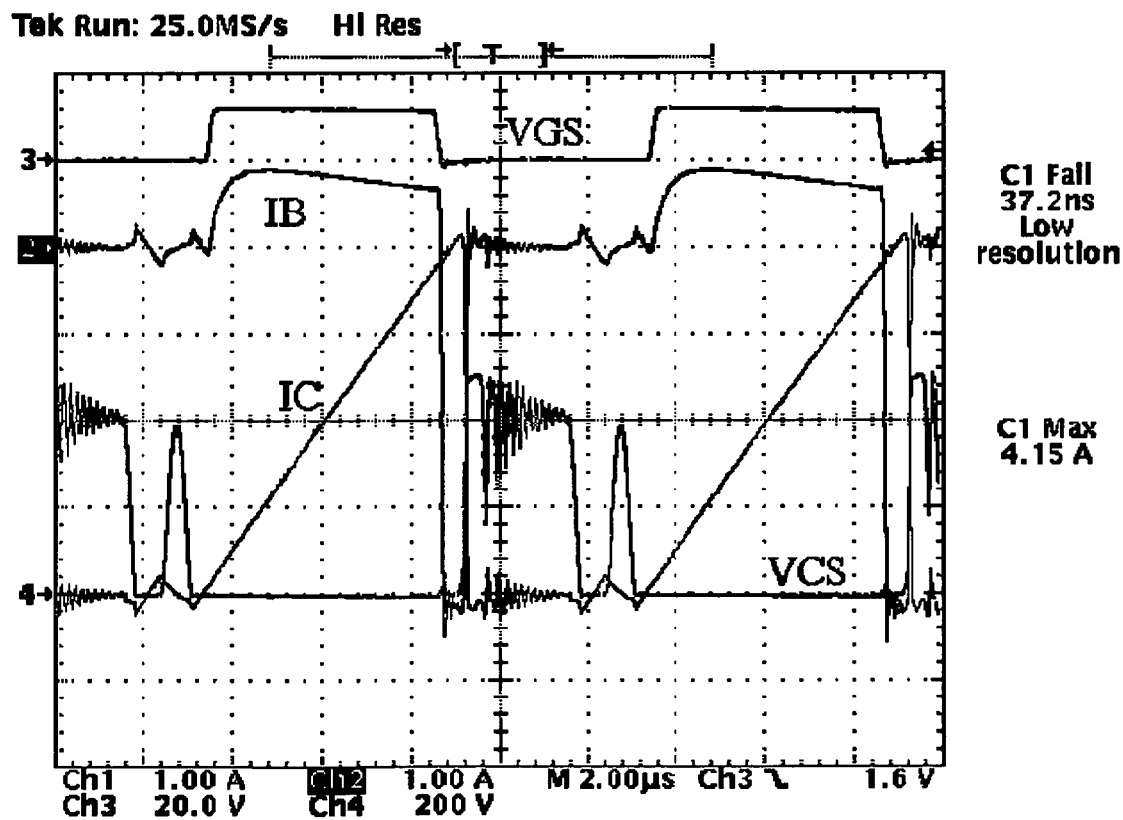
FIG. 2 schematically shows the wave forms of a discontinuous flyback converter with a null turn-on current according to the prior art.
Figure 3:
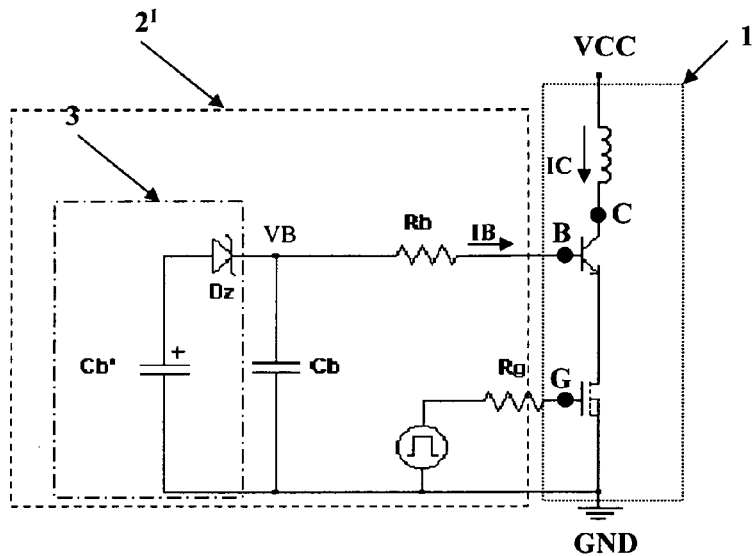
FIG. 3 schematically shows an optimised emitter-switching driving circuit for a null current turn-on, according to the prior art.
Figure 4:
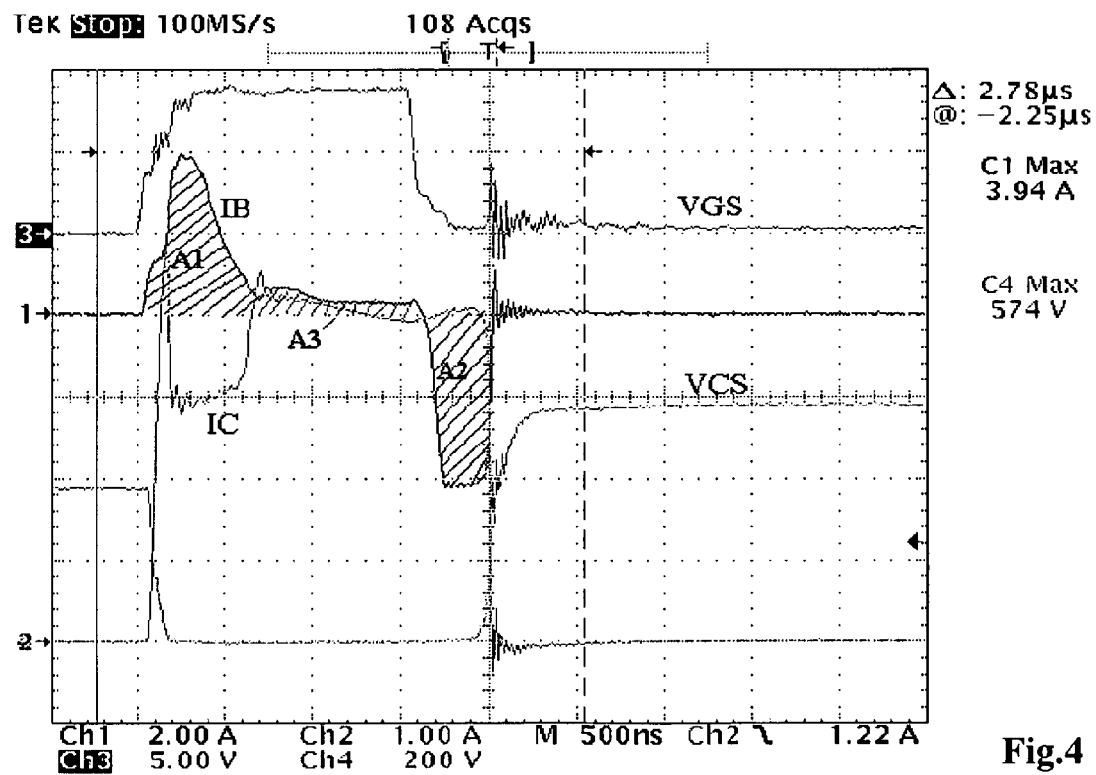
FIG. 4 schematically shows the wave forms of a forward converter obtained with the driving circuit of FIG. 3, according to the prior art.
Figure 5:
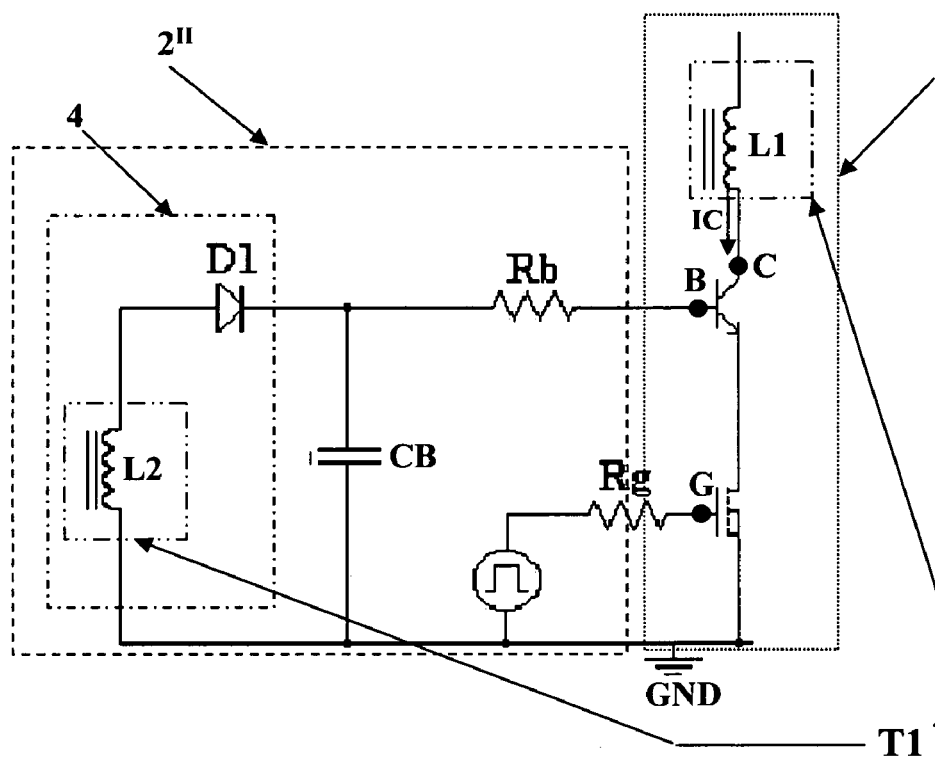
FIG. 5 schematically shows a proportional emitter-switching driving circuit with a current transformer, according to the prior art.
Figure 6:
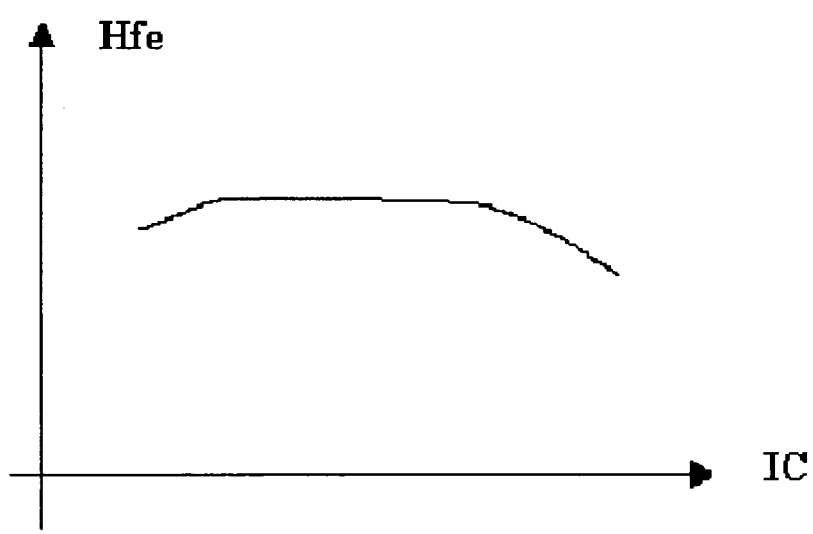
FIG. 6 shows a diagram of the current gain variation of a bipolar transistor as a function of the collector current, according to the prior art.
Figure 7:
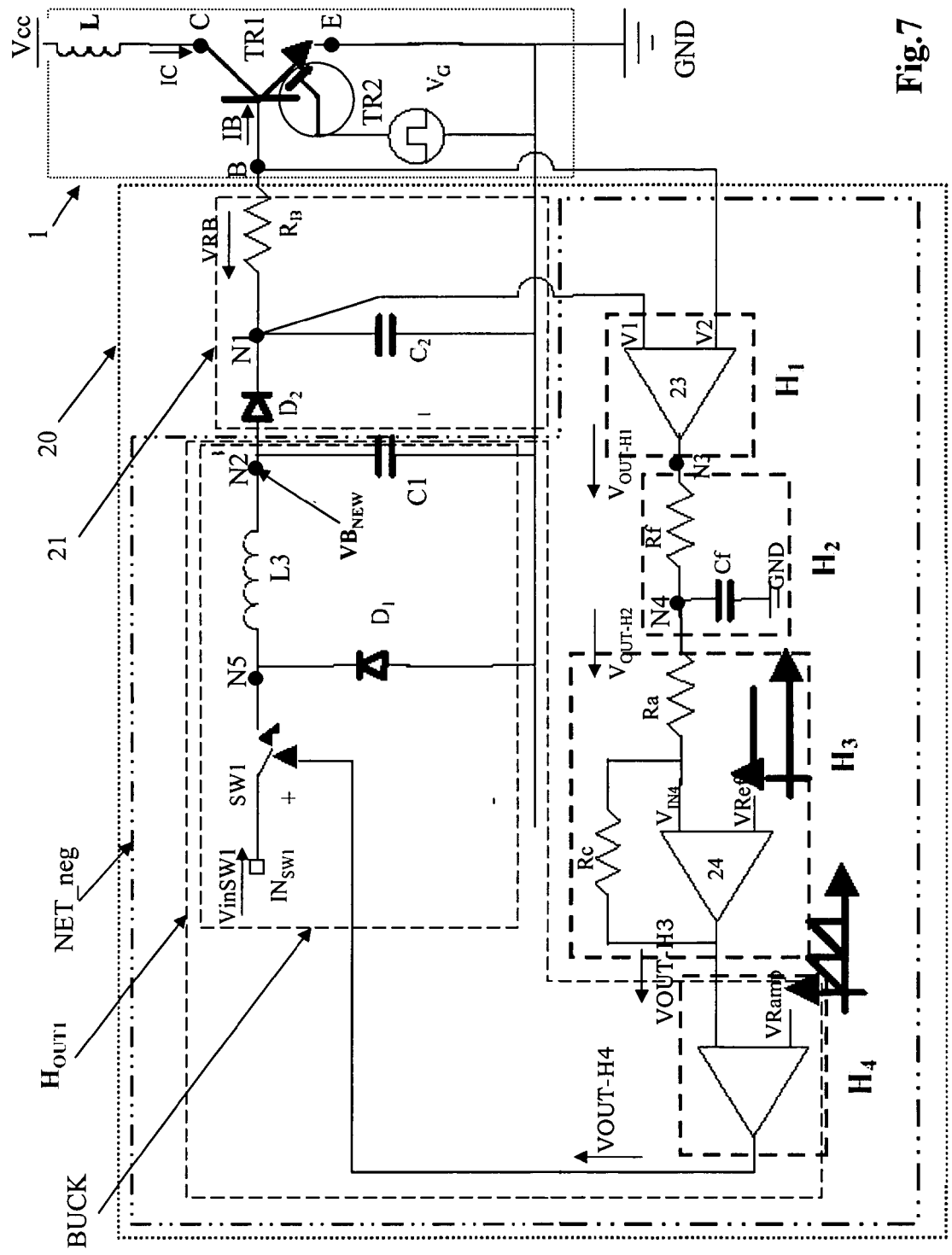
FIG. 7 schematically shows an emitter-switching driving network according to a first embodiment of the present invention.

With reference to the drawings, and particularly to FIG. 7, a first embodiment of a driving network 20 will now be described.

In FIG. 7, components and signals being already in prior art descriptions and having the same structure and operation will be marked with the same previously used labels.

The network 20 is intended to bias a bipolar transistor control terminal B of an emitter-switching block 1.

A control voltage VB is provided to the bipolar transistor control terminal B output from a driving block 21 comprising a resistance RB comprised in turn between the control terminal B and a first circuit node N1, a first capacitor C2 interposed between the first circuit node N1 and the ground GND and a diode D2, allowing the current to flow only towards the bipolar transistor to be driven, interposed between said first circuit node N1 and a second circuit node N2 outside the block 21.

The control terminal B and the first circuit node N1, of the driving block 21, are the terminals of the resistance RB and they are connected to a first comparator block Hi of a negative feedback network NET-neg of the driving network 20, getting two respective voltage values V1 and V2.

The negative feedback network NET_neg of the driving network 20 also comprises a filtering block H2, an amplification block H3, a second comparator block H4 and an output block Hout1.

The first comparator block H1 comprises a differential amplifier 23 receiving at the input the two voltage values V1 and V2 at the inverting and non inverting terminals thereof, a third supply voltage $V_{AL}$ to the power supply terminals, not shown in the drawing, being common also to all the other circuit amplifiers, and it outputs a comparative voltage signal $V_{OUT1-H1}$, which is low (0V) during the storage period and high (Vcc) in the remaining period portion. This signal is taken with reference to a third circuit node N3.

A filtering block H2 receives at the input the comparative voltage signal $V_{OUT1-H1}$ output from the first comparator block H1; this block H2 is composed of a circuit RC comprising a resistance Rf and a capacity Cf being respectively comprised between a fourth circuit node N4 outside the block H2 and the third node N3, and between the circuit node N4 and a ground GND.

The filtering block H2 simply serves to filter the harmonic components of the signal $V_{OUT1-H1}$, received from the comparator block H1, from the onward switching frequency, in order to obtain only the average value.

The filtering block H2 outputs a filtered voltage signal $V_{OUT-H2}$ in correspondence with the fourth node N4.

An amplification block H3, comprising a fedback differential amplifier 24, receives at the input an input signal $V_{IN4}$ and a voltage reference signal Vref, and it outputs an amplified voltage signal $V_{OUT-H3}$. The input signal $V_{IN4}$ is obtained from the filtered voltage signal $V_{OUT-H2}$, under the effect of the voltage drop on an input resistance Ra and under of the effect of a resistance Rc on the feedback loop of the amplifier 24.

The output block Hout1 receives at the input the amplified voltage signal $V_{OUT-H3}$, an input voltage value VinSW1 and it outputs a voltage value $VB_{NEW}$ to bias the emitter-switching circuit 1.

This output block comprises a second comparator block H4 receiving at the input the amplified voltage signal $V_{OUT-H3}$, a triangular reference voltage signal Vramp and it outputs a signal PWM, indicated with $V_{OUT-H4}$.

Advantageously the output block Hout1 further comprises a buck converter BUCK for a DC/DC conversion and outputting a voltage being lower than the voltage received at the input; this converter comprises in turn a switch SW1. The switch SW1 receives at the input the signal VinSW1, the signal $V_{OUT-H4}$ regulating the turn-on time thereof and thus regulating the duty-cycle of the converter BUCK, and it is output-connected to a fifth circuit node N5; the converter BUCK further comprises a diode D1 interposed between the fifth node N5 and the ground GND, allowing the current to flow only towards said fifth node N5 and an inductance L3 interposed between the fifth circuit node and the second circuit node N2 whereto a second capacitor C1 is further connected, interposed in turn between the second circuit node N2 and the ground GND.

Figure 8A:
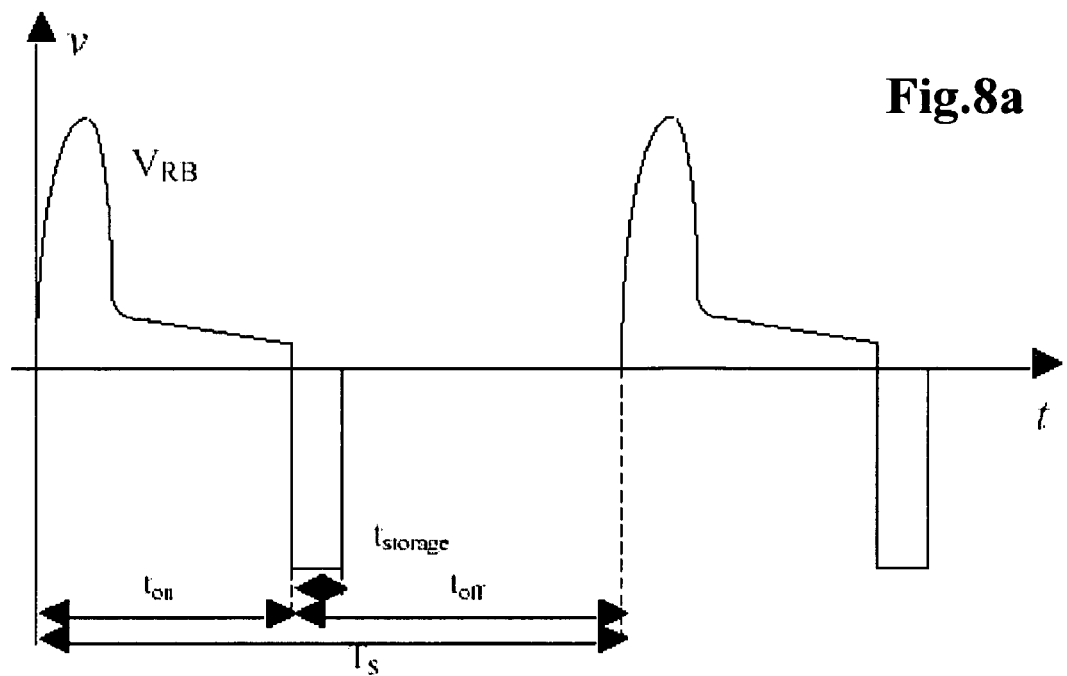
FIGS. 8a, 8b schematically show the wave forms of a first block in the driving network of FIG. 7 according to an embodiment of the present invention.
Figure 8B:
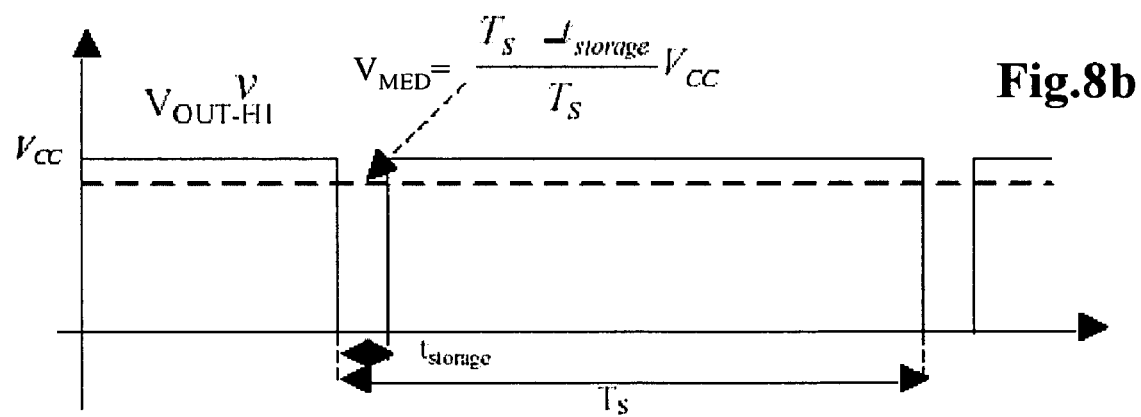
Figure 9A:
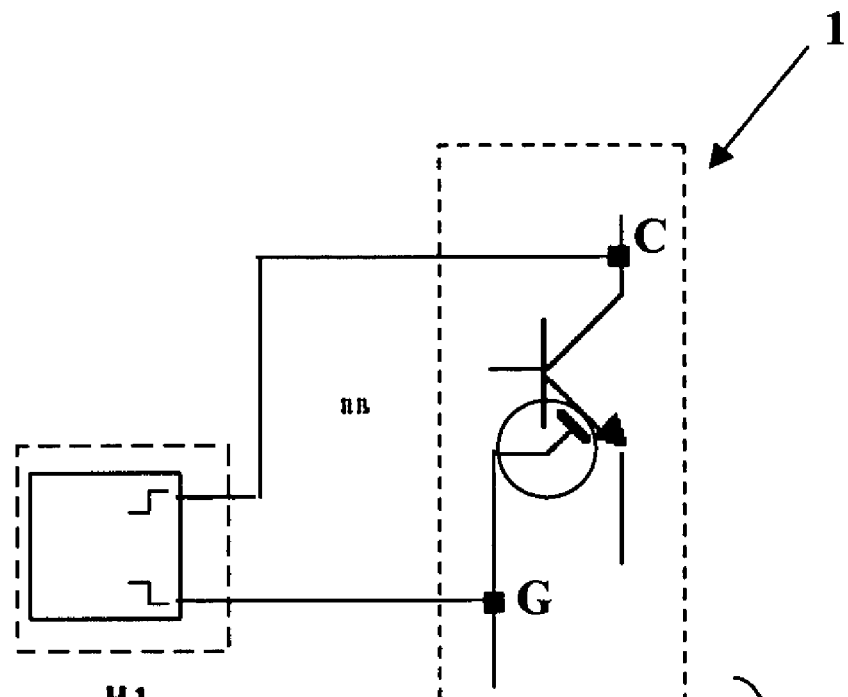
FIG. 9a schematically shows a second embodiment of the first block of FIG. 7.
Figure 9B:
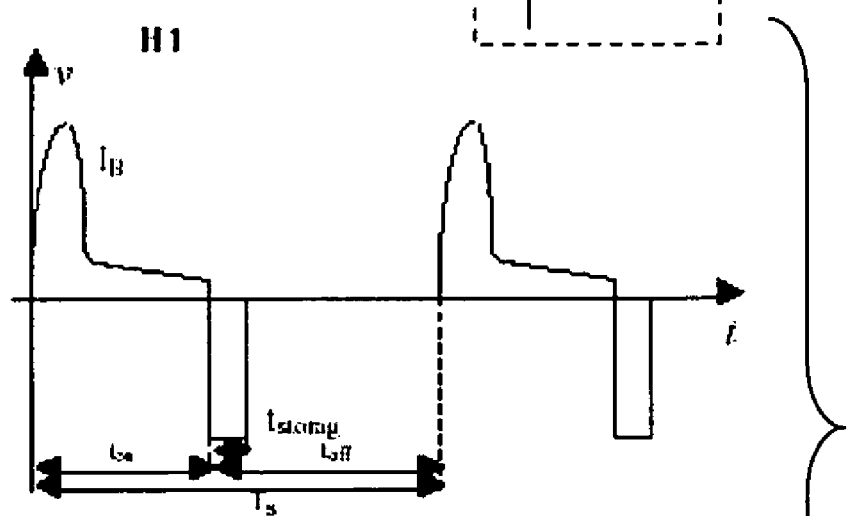
Figure 9B:
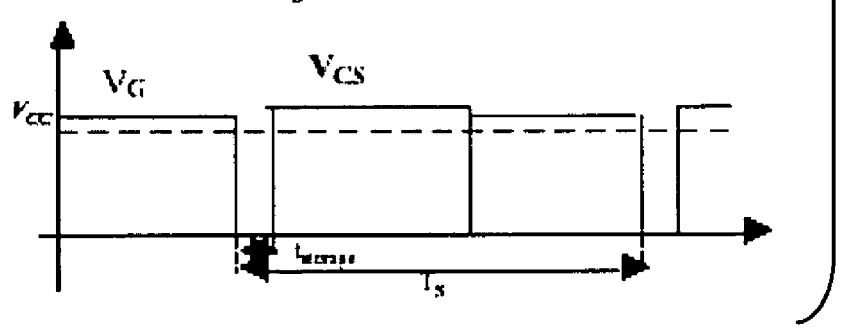

The operation of the driving network 20 is now described, with reference to FIGS. 7, 8, 9.

Once a collector current IC in the bipolar transistor of the emitter-switching block 1 is set, the bias voltage VB variation under the effect of the voltage drop variation on the resistance RB, allows the base current IB value to be varied during the bipolar transistor operation step.

The base current IB value sets the bipolar transistor saturation level, corresponding to the setting of the transistor storage time.

The operating principle of the control diagram shown in FIG. 7 is to measure the storage time indirectly by reading the voltage across the base resistance RB, to compare the value obtained with a reference value, and, by means of a negative feedback network NET_neg, to operate on the duty-cylce of the buck converter BUCK, in order to conveniently vary the bias voltage VB, thus keeping the storage time constant for any noise with respect to the reference value.

The voltage VRB across the base resistance RB is shown in FIG. 8a. Observing that the voltage VRB is negative only during the storage time, by applying this signal between the non inverting terminal and the inverting terminal of a simple comparator, such as, for example, the comparator 23 of the block H1, and by applying a non dual supply voltage VCC to the comparator power supply terminals, not shown in the figure, the signal $V_{OUT\_H1}$ output from the block H1 will have a low value during the storage time (0V) and a high value during the remaining period portion (VCC).

By performing the harmonic breakdown of the signal $V_{OUT\_H1}$, carried out by means of the filtering block H2, a signal is obtained, which is proportional to the storage time, with an average value Vmed being identified by a dotted line in FIG. 8b and by the harmonic components with higher frequencies than the switching frequency. By filtering this signal by means of a low-pass filter with a lower cutting frequency than the switching frequency, a continuous voltage signal is definitely obtained whose value Vmed is proportional to the storage time.

Quantitatively, $$Vmed = \frac{T_S - t_{storage}}{T_S} Vcc = Vcc\left(1 - \frac{t_{storage}}{T_S}\right)$$

The choice of connecting the comparator block H1 so that the output signal $V_{OUT\_H1}$ is always high during the period, and low only during the storage time, originates from the need of having a continuous signal at the input of the amplification block H3 with a higher value than a voltage $V_{BE}$ calculated between the bipolar transistor base and emitter and thus sufficient to ensure the bias of the amplifier input stage.

The storage time could also be drawn from a voltage signal being proportional to the storage time itself exploiting, for example, the MOS transistor gate voltage value VG and the bipolar transistor collector voltage. FIG. 9a shows the structure of the connections between the emitter-switching configuration circuit 1 and the comparator block H1 in a portion of the driving network 20, in order to read the storage time, exploiting the gate and collector signals respectively taken at the MOS transistor control terminal G and at the bipolar transistor conduction terminal C; as shown in FIG. 9b, the falling slope of the gate signal VG is the beginning of the storage time $t_{storage}$ interval and it corresponds to a negative value of the base current IB, while the rising slope of the collector voltage $V_{CS}$ detects the end of the storage time interval.

By exploiting the described gate and collector signal and by means of a logic network which can be easily formulated by a skilled in the art, a squared-wave signal can be obtained with the same features as the previous reading method, i.e. having always a high logic level except from during the storage time.

As a consequence, the same formula being previously cited for calculating the average value Vmed is still valid.

$$Vmed = \frac{T_S - t_{storage}}{T_S} Vcc = Vcc\left(1 - \frac{t_{storage}}{T_S}\right)$$

Alternatively, the just shown storage time reading method, consisting in drawing a voltage signal being proportional to the storage time, in a so-called time-voltage conversion, could also be realized by charging a capacitance at a constant current for the whole storage time, obtaining in practice a voltage value on the capacitance, at the end of the storage time, being proportional to the storage time itself, according to the same above-cited mathematical relationship.

Figure 10:
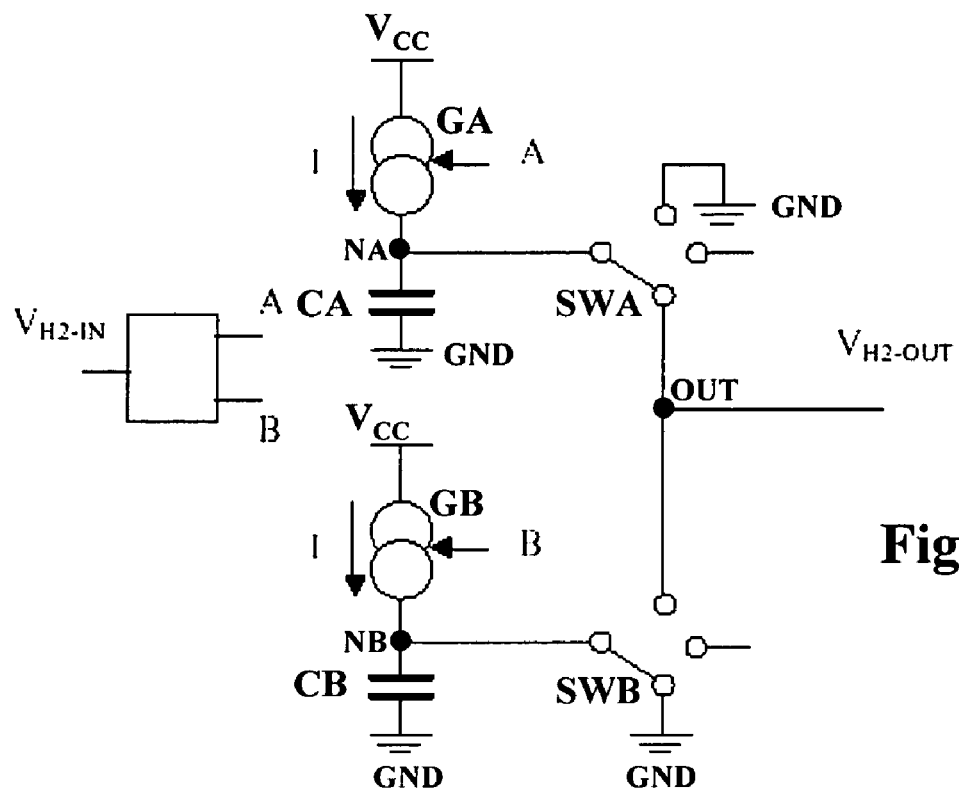
FIG. 10 schematically shows a second block in the driving network of FIG. 7 according to an embodiment of the present invention.

In this case, a filtering block $H2^I$ can be realized by means of the functional diagram of FIG. 10.

In this figure, a signal VH2-IN, corresponding to the $V_{OUT\_H1}$ signal output from the comparator block H1, is at the input of the filtering block $H2^I$ and it is processed in order to generate two activation signals A and B for two generators GA and GB with the same current I; the generator GA is connected to the first voltage reference VCC and, by means of a circuit node NA, to a capacitor CA, connected in turn to the ground terminal GND; the generator GA is also connected, always by means of the circuit node NA, to a switch SWA, allowing or preventing the transmission of the generated signals, in order to let them go out of the filtering block $H2^I$, passing through an output node Out.

The generator GB is connected to a supply voltage Vcc and, by means of a circuit node NB, to a capacitor CB, connected in turn to a ground terminal GND; the generator GB is also connected, always by means of the node NB, to a switch SWB, allowing or preventing the transmission of the signals output from the filtering block $H2^I$, passing through an output node Out.

The capacitors CA and CB are alternately charged with a constant current I by respective current generators GA and GB, for a time interval corresponding to the storage time and they keep the charged voltage value for a period Ts. In this way, in each period one of the capacitors always carries the previous pulse storage time information by means of a signal, indicated with $V_{H2\_OUT}$ in FIG. 10 being detected in the node Out and substantially coinciding with the fourth current node N4, which is used as an input for the amplification block H3.

Figure 11:
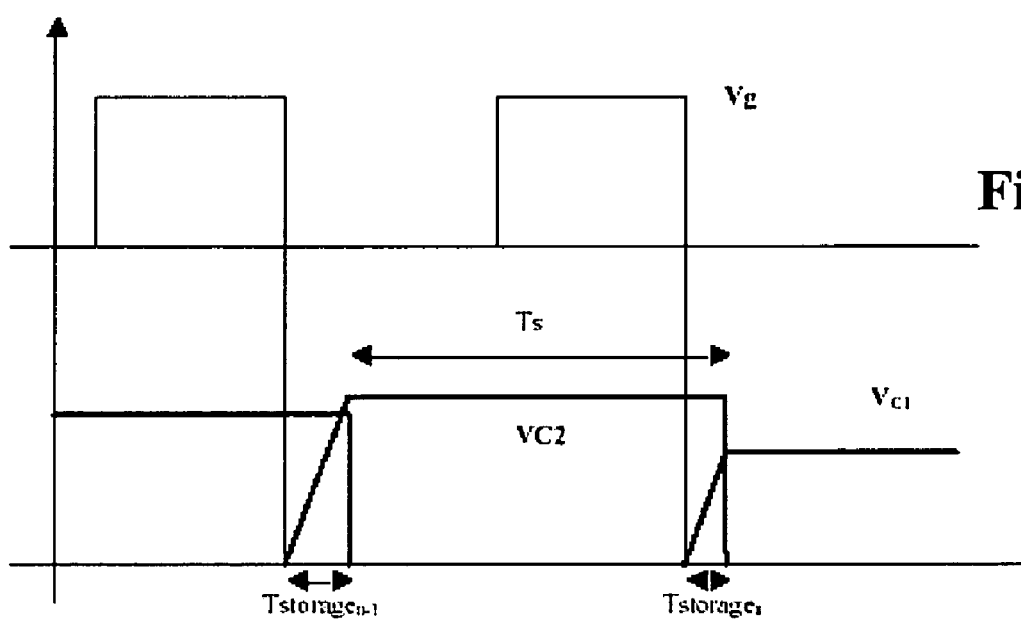
FIG. 11 schematically shows the wave forms drawn from the diagram of FIG. 10.

FIG. 11 shows the signal trends on the capacitors CA and CB of FIG. 10, with reference to the MOS transistor control voltage VG.

The amplification block H3 serves to amplify the voltage signal $V_{H2\_OUT}$ output from the block $H2^I$ or the signal $V_{OUT\_H2}$ output from the block H2 and to compare them with a reference signal Vref to output an amplified signal $V_{OUT\_H3}$.

The second comparator block H4 serves as a PWM modulator.

Figure 12:
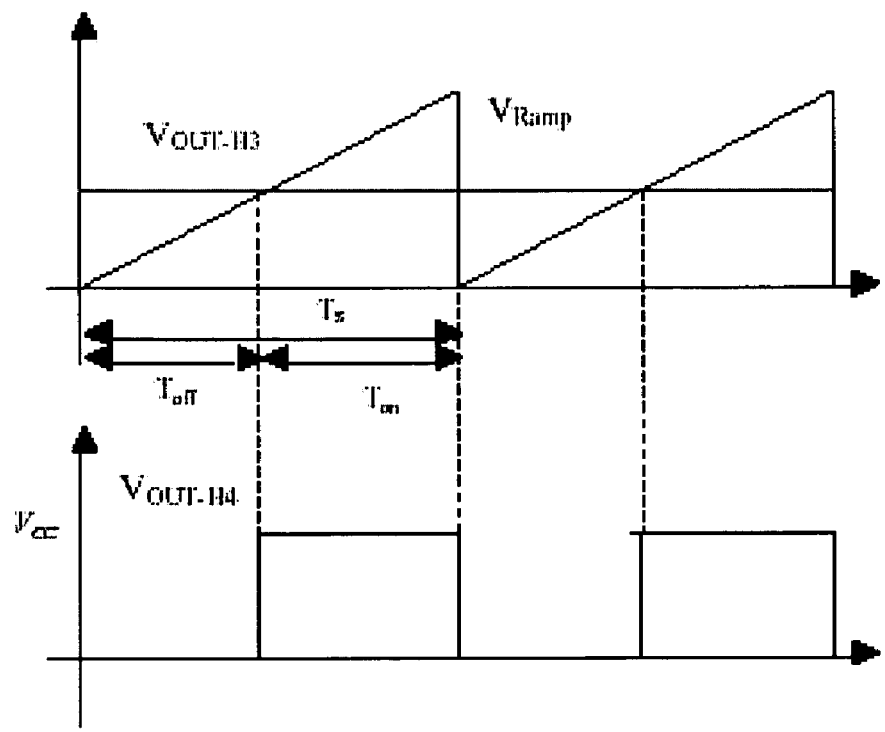
FIG. 12 schematically shows the wave forms of a third block in the driving network of FIG. 7, according to an embodiment of the present invention.

FIG. 12 shows the wave forms of the signal $V_{OUT\_H3}$ and of a triangular reference signal $V_{ramp}$, both at the input of the second comparator block H4; this figure also shows the signal $V_{OUT\_H4}$ of the PWM type, output from said comparator. In practice, by comparing the triangular reference signal $V_{ramp}$ with the signal $V_{OUT\_H3}$, output from the differential amplifier of the amplification block H3, by means of the comparator block H4, comprised in the output block Hout1, a signal $V_{OUT\_H4}$ of the PWM type is obtained, which is directed towards the switch SW1 of the converter BUCK of the output block Hout1, in order to regulate the voltage $VB_{NEW}$ output from said block Hout1.

The driving network 20, related to the first embodiment of the present invention, operates with standard operating currents; moreover, the insertion of the switch SW1 allows the driving network to be used also when the operating currents become very high, for example in very high power applications.

Figure 13:
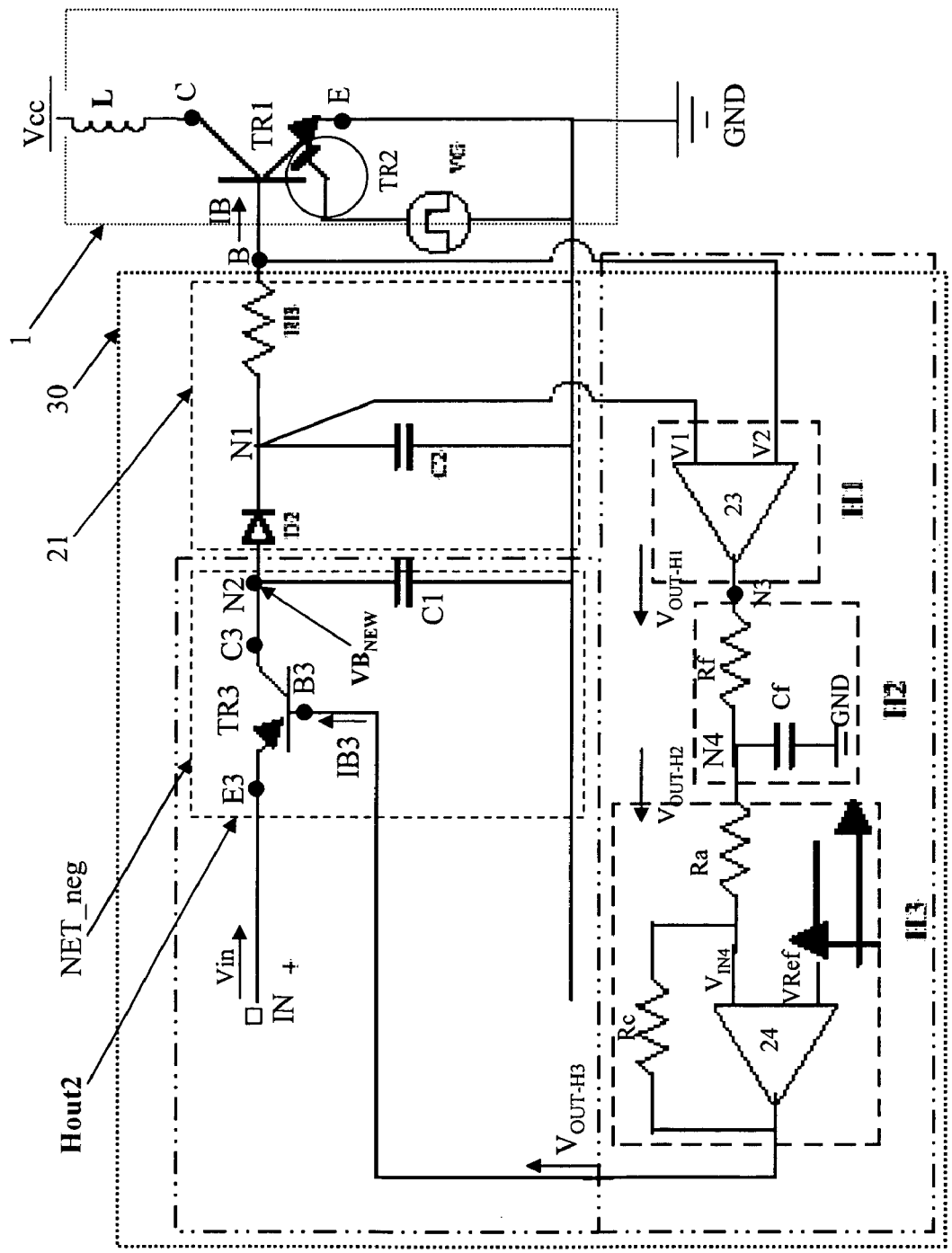
FIG. 13 schematically shows an emitter-switching driving network, according to a second embodiment of the present invention.

In a second embodiment of the driving network, related to the present invention, the storage time is regulated by replacing the output block Hout1 comprising the converter BUCK with a linear regulation block Hout2, as shown in FIG. 13.

This second embodiment is particularly suitable for low power applications.

This figure, wherein the components and signals being already in FIG. 7 and having the same structure and operation will be marked with the same previously used labels, shows a driving network 30 performing a linear regulation of the voltage VB at the input of the bipolar transistor control terminal B of the emitter-switching circuit 1.

The difference with respect to the first preferred embodiment is represented by the linear regulation block Hout2 receiving at its input the output $V_{OUT\_H3}$ of the amplifier 24 of the block H3, as shown in FIG. 13, replacing the output block Hout1 comprising the converter BUCK, shown in FIG. 7.

In the block Hout2, similarly to known linear regulation systems, a second bipolar transistor TR3 of the PNP type is used, whose base current IB3 is modulated by the storage time control circuit.

The block Hout2 thus comprises the transistor TR3 which is connected, by means of a control (base) terminal B3 thereof to the output of the block H3, a first conduction terminal, particularly an emitter terminal E3, connected to an input terminal IN and a second conduction terminal, particularly a collector terminal C3, connected to the traditional driving block 21 coinciding with the second circuit node N2. A capacity C1 is interposed between the collector terminal C3 and the ground GND.

In this second preferred embodiment a modulation of the PWM type is no longer necessary; the output $V_{OUT\_H3}$ of the amplifier 24 of the block H3, in the absence of a following stage for amplifying the current, directly drives the base terminal B3 of the bipolar transistor TR3; by varying the current IB3 output from the amplifier 24, the voltage drop between the collector C3 and the emitter E3 of the transistor TR3 varies, letting the latter vary a voltage $VB_{NEW}$ output from the node N2 with respect to an input signal VIN, at the emitter terminal E3 thereof. The output voltage $VB_{NEW}$ is then used as an input to the driving circuit 21 to bias the emitter-switching 1.

Advantageously, the described driving network 30, with a linear output, besides being a simpler solution from the circuit point of view than the first preferred embodiment of FIG. 7, also involves a lower cost and it provides greater integration opportunities.

Figure 15:
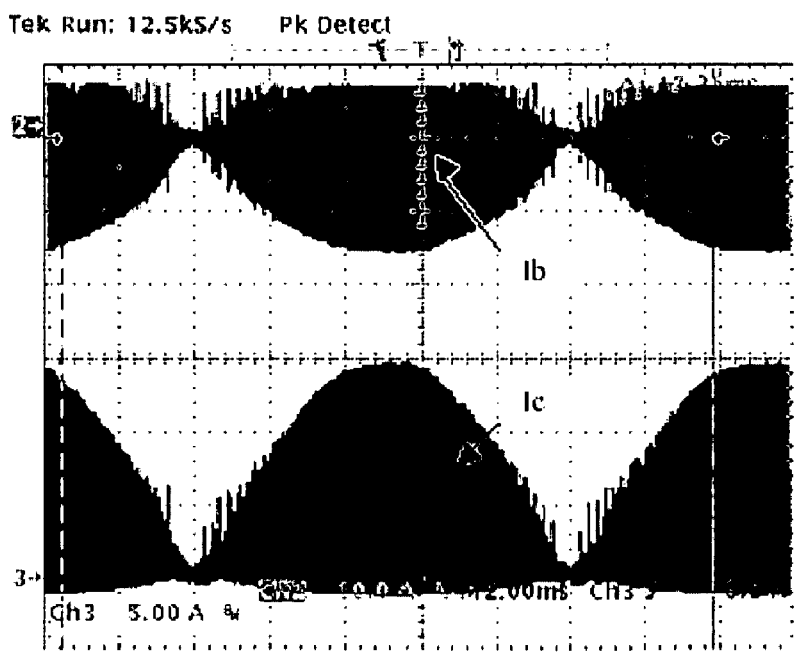
FIGS. 15 to 21 show the wave forms of signals drawn by the embodiment of FIG. 14.

In order to demonstrate the real operation of the driving circuit according to embodiments of the invention, a PFC application has been considered, wherein, even with a constant load, for the power factor correction role played by this application, the power device, in a period of 10 ms, sees the operating conditions vary from a null current to the highest current. As shown in the wave form of FIG. 15, the PFC is the worst case, since a variation of the operating conditions continuously occurs, and wherein without the driving network according to embodiments of the present invention the use of a cascode configuration could not be envisaged; FIG. 15 shows the wave forms of the collector and base voltages IC and IB.

However it must be noticed that the driving network provided in the invention can be used in all those applications wherein, because of a load variation or because of an input variation, a variation of the power device operating conditions occurs. This network puts the cascode configuration in the optimum operating conditions, as previously explained.

Figure 14:
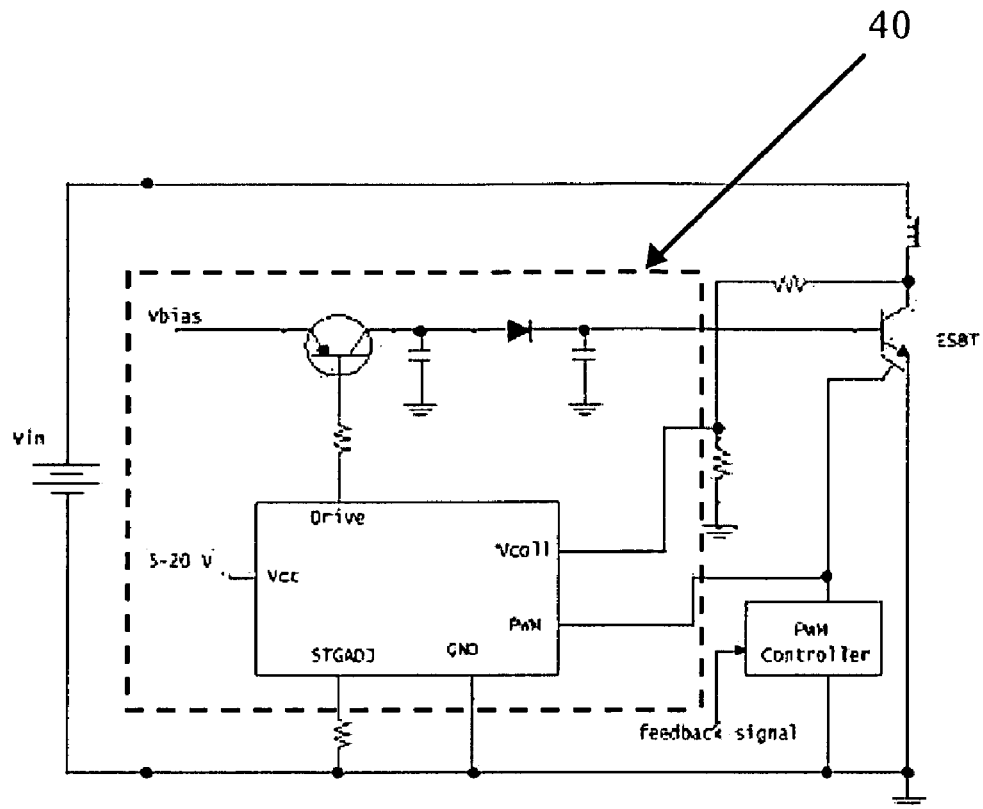
FIG. 14 shows a circuit diagram implementing the invention used in the tests on PFC according to an embodiment of the present invention.

For the PFC application, used as a testing means, the control method embodiment has been that of FIG. 14. This figure shows a testing driving network 40 wherein it has been chosen to read the storage time by means of the collector and gate signals, as previously described with reference to FIGS. 9a and 9b, and to use a linear regulation diagram, as the one described in the second preferred embodiment of the present invention, shown in FIG. 13.

In order to show the operation of the driving network 30, referring to the component and signal references of FIG. 13, the wave forms of the base and collector currents IB and IC and of the collector voltage Vcc will be compared, both with a constant base power supply, i.e. with VB'=constant and with a power supply by means of the driving network 30.

The power supply VB is chosen equal to 5V, while in the constant power supply case, the power supply VB' was set to 3.5V. This value ensured the device operation at the highest operating current, with the same storage time which is set by the driver in the proposed solution. The optimum storage time is of about 500 ns.

Figure 16:
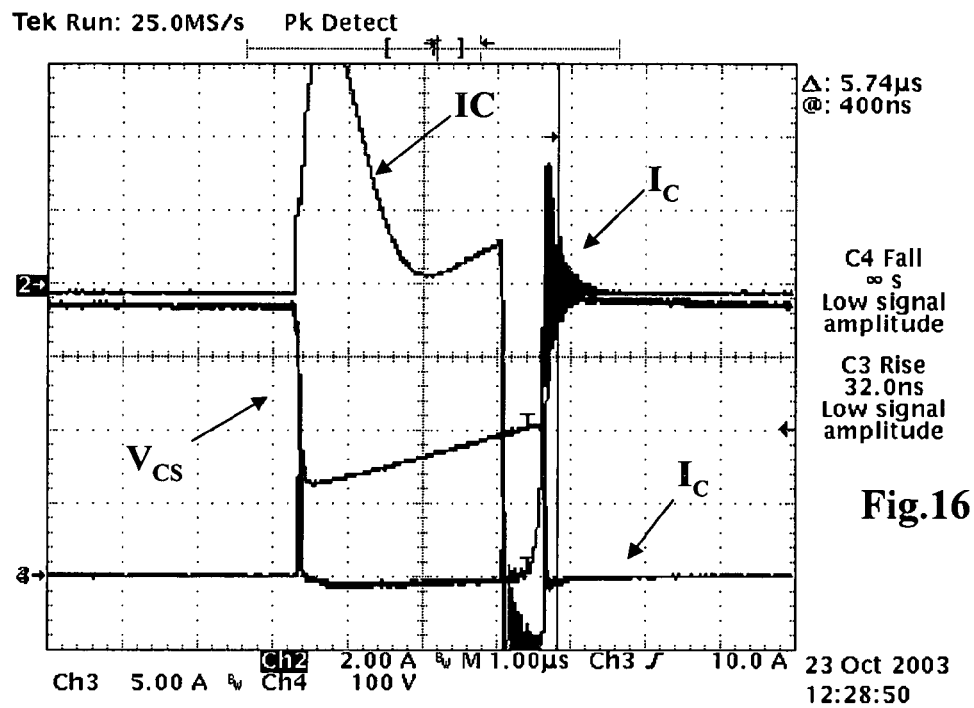
Figure 19:
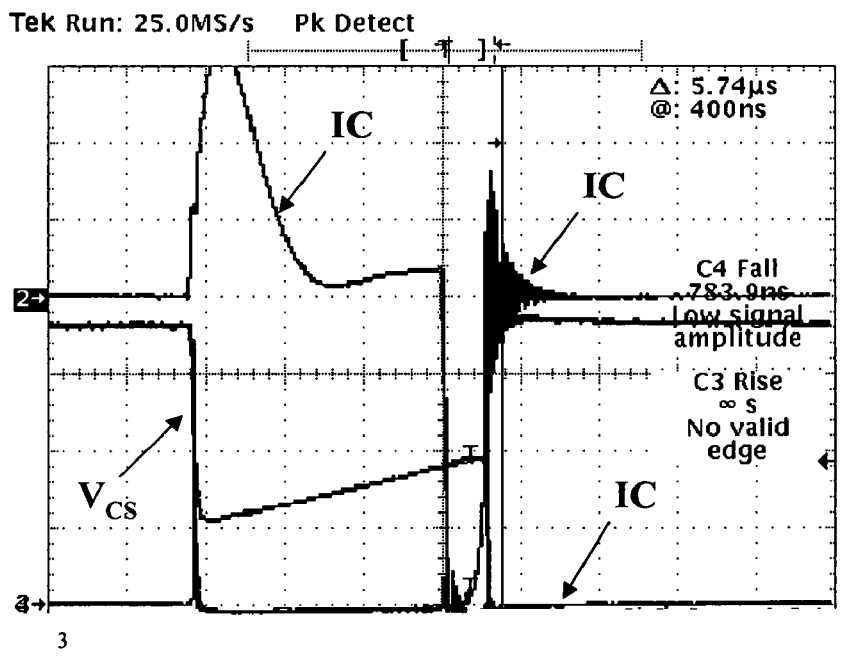

FIGS. 16 and 19 show wave forms being respectively related to a constant bias of the base B and by means of the driving network 30, in the high collector current IC case.

By comparing FIG. 16 with FIG. 19, totally similar operating situations can be observed; in fact the collector current IC reaches about 10A and the storage time is almost equal in both figures.

Figure 17:
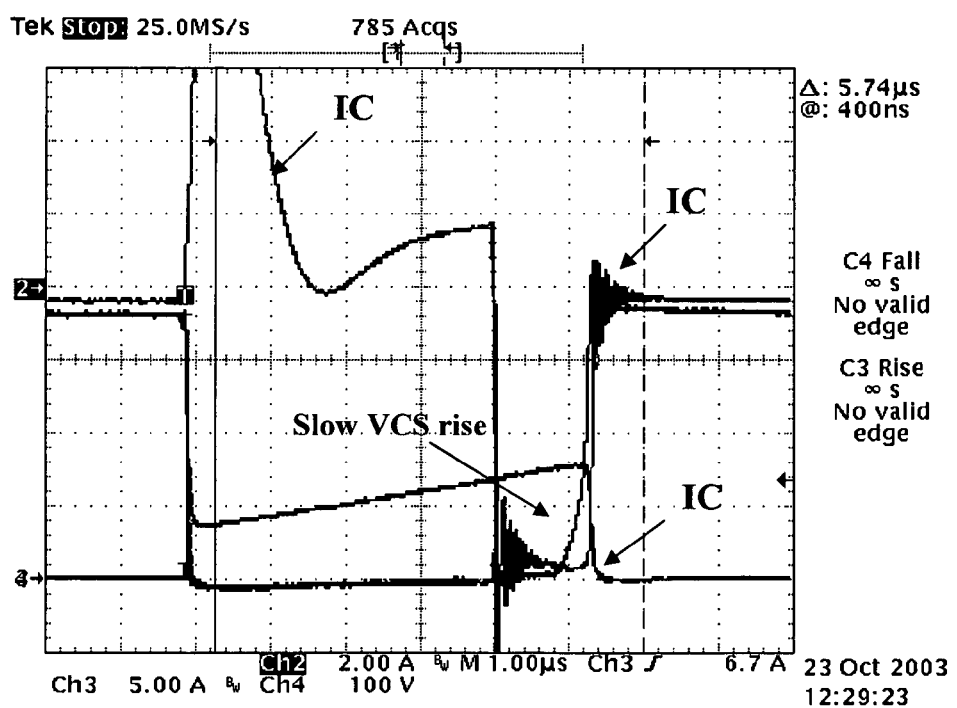
Figure 20:
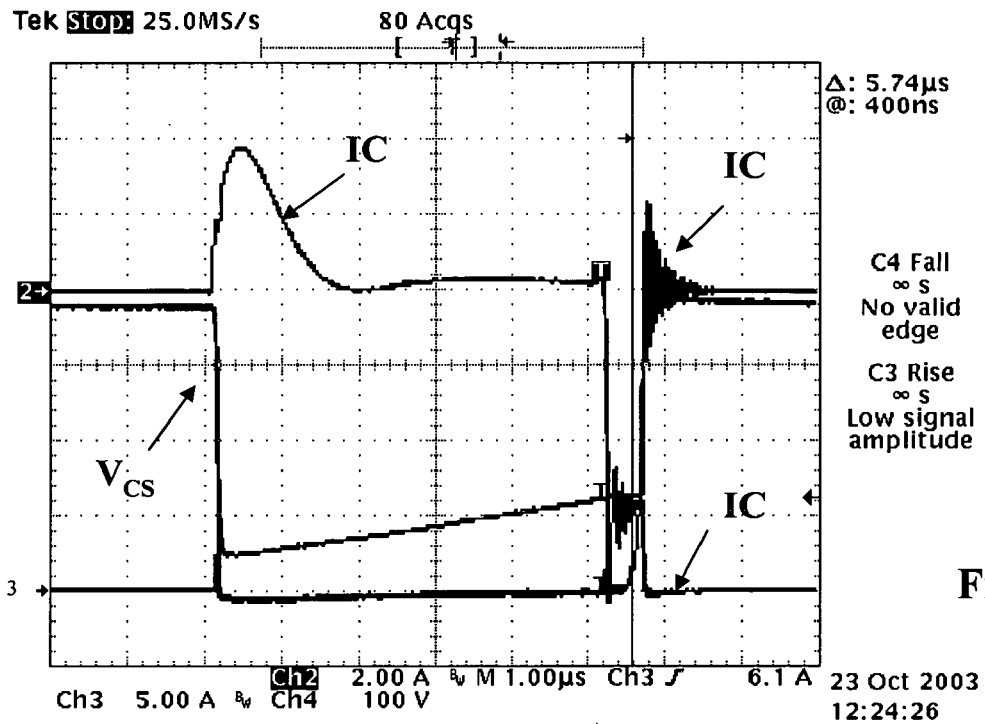

FIGS. 17 and 20 show wave forms being respectively related to a constant bias of the base B and by means of the driving network 30, in the average collector current IC case.

By comparing FIG. 17 with FIG. 20, wherein the collector current is of about 7.5 A, it can be seen how in the constant base bias case, of FIG. 17, the storage time is of about 1.5 µs, while in FIG. 20, by using the driving network 30, the storage time is constant.

Figure 18:
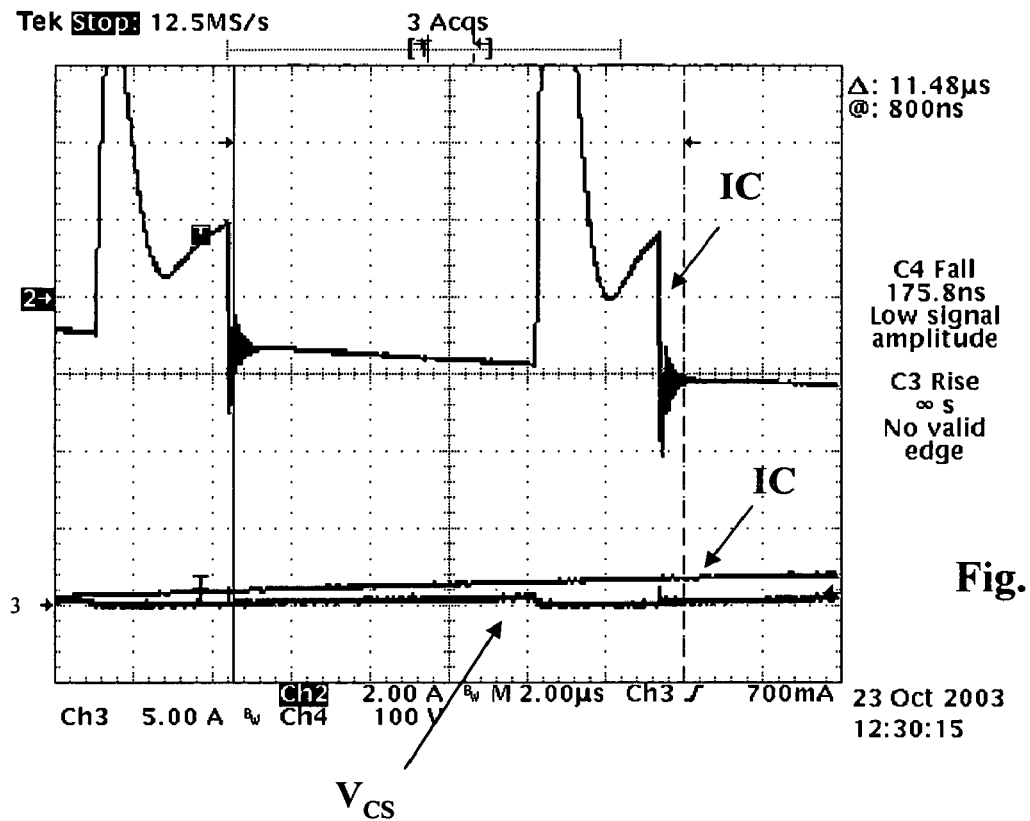
Figure 21:
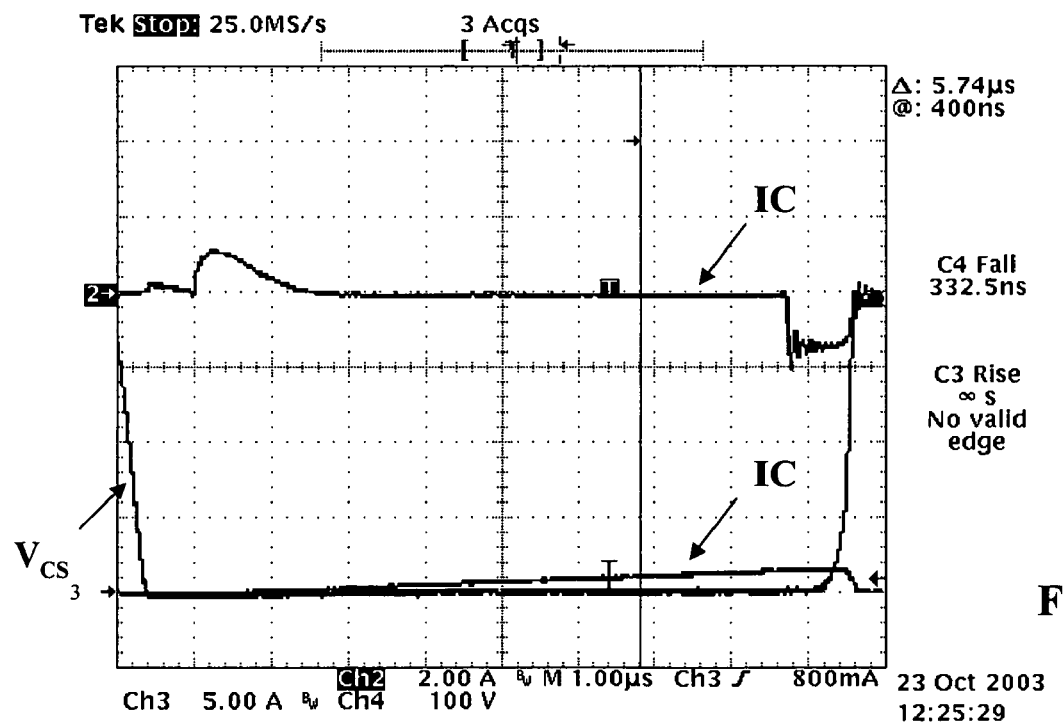

Finally, in order to further emphasise the driver operation, the wave forms of FIG. 18 and of FIG. 21 are compared; in this case, in FIG. 18, it can be seen how the constant bias has created an excessive device saturation situation, and the storage time has become higher than the turn-off time $t_{off}$, thus generating the loss of some switchings. This happens because the following gate pulse occurs even before the device is actually turned off. In FIG. 21 it can be instead seen how also in this situation the driver keeps the storage time constant.

The storage time variation, in the constant power supply case, besides generating an application malfunction, for low current values, generates a device over-saturation which slows down the device during the turn-off step.

In fact, by comparing the collector voltage VCS trend in FIGS. 17 and 20, it can be seen how the Vcs during the turn-off step requires a longer time for passing from the saturation value Vcssat thereof to the 380V clamp voltage.

The slower turn-off creates greater power dissipations during the low-current turn-off step, this effect results in a device temperature increase in the application global operation.

In order to show this last aspect, in Table 1 below, once a same input power for the PFC operation is set, and keeping the same power device, i.e. an emitter-switching bipolar transistor, it can be observed how the constant bias makes the cascode configuration totally unsuitable for this kind of applications, while by introducing the driving network, subject-matter of embodiments of the present invention, good operating conditions can be reached.

TABLE 1

| Bias method | Power Input | Power Output | IB average | Device temperature |
|---|---|---|---|---|
| VB' = 3.5 V | 1000 W | 837 W | 0.5 A | >110° |
| with driver | 1000 W | 850 W | 0.15 A | 73° |

In conclusion, the driving network shown in the described embodiments of the present invention allows the following advantages to be reached:

Correct bias of a bipolar transistor base in an emitter-switching configuration for each value of the collector current, optimizing the cascode configuration operating performances for each operating condition in applications with variable operating currents, and thus in the global application operation. In fact a system being capable to follow the current gain variation hfe law is obtained.

Automatic bias network regulation for each kind of hfe spread variation.

Fixed storage time, and regulated at the lowest value for each operating condition, and thus possibility of using the cascode configuration in high switching frequency applications.

From the foregoing it will be appreciated that, although specific embodiments of the invention have been described herein for purposes of illustration, various modifications may be made without deviating from the spirit and scope of the invention.

The invention claimed is:

1. A driving network for an emitter-switching circuit wherein said emitter-switching circuit comprises a pair of cascode-configured transistors, the one of the bipolar type and the other of the MOS type, and said driving network of the type comprising a driving block for respective conduction terminals and of said pair of transistors, and wherein the driving block comprises:
   sensor means in said driving block, including a resistor connected in series to said bipolar transistor control terminal suitable for measuring voltage;
   a first comparator block connected at the input to the terminals of said resistor of said sensor means and at the output to a third node of said first comparator block comparing said measured voltage and generating a voltage signal which is proportional to the storage time of said emitter-switching block; and
   a negative feedback network, between the output of said first comparator block and said driving block to provide a voltage value to said driving block to bias said conduction terminal of the bipolar transistor of said emitter-switching circuit in order to regulate the storage time thereof.

2. A driving network for an emitter-switching circuit wherein the emitter-switching circuit comprises a pair of cascode-configured transistors, one of bipolar type and the other of MOS type, and the driving network of the type comprising a driving block for respective conduction terminals and of the pair of transistors, and wherein the driving block comprises:
   sensor means in the driving block, suitable for measuring a voltage to be compared with a reference value in a first comparator block;
   a negative feedback network, between the output of the first comparator block and the driving block to provide a voltage value to the driving block to bias the conduction terminal of the bipolar transistor of the emitter-switching circuit in order to regulate the storage time thereof; and wherein the first comparator block is connected at the input to the terminals of a resistor of the sensor means, connected in turn in series to the bipolar transistor control terminal and at the output to a third circuit node, generating a reading voltage signal of the storage time of the emitter-switching block.

3. A driving network according to claim 2 further comprising a filtering block connected to said comparator block by means of said third circuit node, said block comprising a circuit RC wherein a resistor and a capacitor are interposed respectively between said third circuit node and a fourth circuit node outside said block and between a supply voltage and said fourth node.

4. A driving network according to claim 3 further comprising an amplification block connected to said fourth circuit node, said block comprising in turn a fedback differential amplifier, anticipated by an input resistance and having a resistance on the feedback loop thereof.

5. A driving network according to claim 4, comprising an output block comprising in turn a comparator block connected to a DC/DC converter of the Buck type comprising in turn a switch connected to an input node and to a fifth circuit node, a diode interposed between said fifth node and second supply voltage and an inductance interposed between said fifth circuit node and said second circuit node.

6. A driving circuit according to claim 5 wherein said converter block further comprises a second capacitor interposed in turn between said second circuit node and said second supply voltage.

7. A driving network according to claim 4, wherein said output block comprises a transistor of the bipolar type which is connected, by means of a control terminal thereof to the output of said amplification block, an emitter terminal, connected to an input terminal, a collector terminal, connected to said driving block and substantially coinciding with said second circuit node, a capacitor interposed between said collector terminal and said second supply voltage.

8. A driving network for an emitter-switching circuit wherein said emitter-switching circuit comprises a pair of cascode-configured transistors, one of bipolar type and the other of MOS type, and said driving network is of the type comprising a driving block for respective conduction terminals and of said pair of transistors, and wherein the driving block comprises:
   a comparator block which is connected to a bipolar transistor conduction terminal and to a MOS transistor control terminal of said emitter-switching to measure a voltage to be compared with a reference value; and
   a negative feedback network, between the output of said comparator and said driving block to provide a voltage value to said driving block to bias said conduction terminal of the bipolar transistor of said emitter-switching circuit in order to regulate the storage time thereof.

9. A driving network according to claim 8, further comprising a filtering block H2' comprising in turn a charging circuit of two generators and with the same current receiving at the input two respective activation signals and, said generators and being connected to a first supply voltage and, by means of circuit nodes, and respectively, to respective capacities and, connected in turn to said ground terminal GND.

10. A driving network according to claim 9, wherein said generators and are connected by means of said respective circuit nodes and, to switches and respectively, allowing or preventing the transmission of the signals output from said filtering block, in a node Out, substantially coinciding with said fourth node N4.

11. A driving network according to claim 10, further comprising an amplification block connected to said fourth circuit node, said block comprising in turn a feedback differential amplifier, anticipated by an input resistance and having a resistance on the feedback loop thereof.

12. A driving network according to claim 11, comprising an output block comprising in turn a comparator block connected to a DC/DC converter of the Buck type comprising in turn a switch connected to an input node and to a fifth circuit node, a diode interposed between said fifth node and said second supply voltage and an inductance interposed between said fifth circuit node and said second circuit node.

13. A driving network according to claim 12, wherein said converter block further comprises a second capacitor, interposed in turn between said second circuit node and said second supply voltage.

14. A driving network according to claim 11, wherein said output block comprises a transistor of the bipolar type which is connected, by means of a control terminal thereof to the output of said amplification block, an emitter terminal, connected to an input terminal, a collector terminal, connected to said driving block and substantially coinciding with said second circuit node, a capacitor interposed between said collector terminal and said second supply voltage.

15. A driving circuit configured to be coupled to control nodes of a cascode-connected bipolar and MOS transistor for an emitter-switching circuit, the driving circuit comprising:
 a sensor configured to be coupled to at least one of the bipolar transistor and the MOS transistor, the sensor operable to sense a parameter of at least one of the bipolar and MOS transistors and to generate a parameter signal responsive to the sensed parameter; and
 a feedback circuit coupled to the sensor and to the control node of the bipolar transistor, the feedback circuit operable to develop a bias voltage on the control node in response to the parameter signal; and
 wherein the sensor is configured to be coupled to a control node of the MOS transistor and to a collector node of the bipolar transistor, and wherein the sensor is operable to sense the voltages on these respective nodes and to generate the parameter signal in response to these sensed voltages.

16. The driving circuit of claim 15 wherein the parameter sensed by the sensor is a current flowing through the control node of the bipolar transistor and wherein the parameter signal corresponds to a sensed current signal.

17. The driving circuit of claim 16 wherein the sensor comprises a resistor coupled in series with the control node of the bipolar transistor to sense current flowing through the control node and wherein the sensed current signal corresponds to a voltage across the resistor.

18. The driving circuit of claim 15 wherein the feedback circuit is further operable to generate a pulse width modulated signal having a duty cycle that is a function of the parameter signal and wherein the feedback circuit includes a DC/DC converter operable to develop the bias voltage on control node of the bipolar transistor in response to the pulse width modulated signal.

19. The driving circuit of claim 18 wherein the DC/DC converter comprises a BUCK converter.

20. The driving circuit of claim 15 wherein the feedback circuit is further operable to generate a linearly varying feedback signal in response to the parameter signal and wherein the feedback circuit includes a linear regulator operable to develop the bias voltage on the control node of the bipolar transistor in response to the linearly varying feedback signal.

21. The driving circuit of claim 20 wherein the linear regulator comprises a bipolar transistor.

22. An electronic system, comprising:
 an electronic subsystem including,
  a driving circuit configured to be coupled to control nodes of a cascode-connected bipolar and MOS transistor for an emitter-switching circuit, the driving circuit including,
   a sensor configured to be coupled to at least one of the bipolar transistor and the MOS transistor, the sensor operable to sense a parameter of at least one of the bipolar and MOS transistors and to generate a parameter signal responsive to the sensed parameter; and
   a feedback circuit coupled to the sensor and to the control node of the bipolar transistor, the feedback circuit operable to develop a bias voltage on the control node in response to the parameter signal, and
  wherein the sensor is configured to be coupled to a control node of the MOS transistor and to a collector node of the bipolar transistor, and wherein the sensor is operable to sense the voltages on these respective nodes and to generate the parameter signal in response to these sensed voltages.

23. The electronic system of claim 22 wherein the electronic subsystem comprises a power factor controller.

24. An electronic system, comprising:
 a switching power supply operating at greater than 100 KHZ, the switching power supply including,
  a driving circuit configured to be coupled to control nodes of a cascode-connected bipolar and MOS transistor for an emitter-switching circuit, the driving circuit including,
   a sensor configured to be coupled to at least one of the bipolar transistor and the MOS transistor, the sensor operable to sense a parameter of at least one of the bipolar and MOS transistors and to generate a parameter signal responsive to the sensed parameter; and
   a feedback circuit coupled to the sensor and to the control node of the bipolar transistor, the feedback circuit operable to develop a bias voltage on the control node in response to the parameter signal.

25. The electronic system of claim 22 wherein the electronic subsystem comprises an induction heating system.

26. A method of controlling an emitter switching circuit including a cascode-connected bipolar and MOS transistor, the method comprising:
 sensing a parameter of at least one of the bipolar transistor and the MOS transistor; wherein the sensed parameter includes a voltage on a collector node of the bipolar transistor and a voltage on a control node of the MOS transistor
 developing a bias voltage in response to the sensed parameter; and
 applying the developed bias voltage to a control node of the bipolar transistor.

27. The method of claim 26 wherein the sensed parameter includes a current flowing through the control node of the bipolar transistor.

28. The method of claim 26 wherein developing the bias voltage includes generating a pulse width modulated signal responsive to the sensed parameter.

* * * * *